US012722167B2

(12) United States Patent
Marzbanrad et al.

(10) Patent No.: US 12,722,167 B2
(45) Date of Patent: Sep. 1, 2026

(54) FLEXIBLE POLYTETRAFLUOROETHYLENE SUBSTRATE WITH ELECTRICAL CIRCUIT LAYER AND METHOD THEREFOR

(71) Applicants: Bahareh Marzbanrad, Waterloo (CA); Hamid Jahed, Waterloo (CA)

(72) Inventors: Bahareh Marzbanrad, Waterloo (CA); Hamid Jahed, Waterloo (CA)

( * ) Notice: Subject to any disclaimer, the term of this patent is extended or adjusted under 35 U.S.C. 154(b) by 176 days.

(21) Appl. No.: 18/518,557

(22) Filed: Nov. 23, 2023

(65) Prior Publication Data

US 2024/0165644 A1 May 23, 2024

Related U.S. Application Data

(60) Provisional application No. 63/427,782, filed on Nov. 23, 2022.

(51) Int. Cl.

| | |
|---|---|
| ***B05B 7/14*** | (2006.01) |
| ***C08K 3/08*** | (2006.01) |
| ***C08K 3/22*** | (2006.01) |
| ***C08K 3/36*** | (2006.01) |
| ***C09D 1/06*** | (2006.01) |
| ***H05K 1/02*** | (2006.01) |
| ***H05K 1/03*** | (2006.01) |

(Continued)

(52) U.S. Cl.

CPC .............. *B05B 7/1486* (2013.01); *C08K 3/08* (2013.01); *C08K 3/22* (2013.01); *C08K 3/36* (2013.01); *C09D 1/06* (2013.01); *H05K 1/0209* (2013.01); *H05K 1/034* (2013.01); *H05K 1/189* (2013.01); *C08K 2003/0812* (2013.01); *C08K 2003/085* (2013.01); *C08K 2003/2227* (2013.01); *C08K 2003/2241* (2013.01); *C08K 2201/001* (2013.01); *C08K 2201/005* (2013.01)

(58) Field of Classification Search

None

See application file for complete search history.

(56) References Cited

U.S. PATENT DOCUMENTS 3,676,566 A * 7/1972 McBride ................ H01B 3/308 174/120 SR
4,634,631 A * 1/1987 Gazit ...................... B32B 15/08 428/432
2018/0168026 A1* 6/2018 Lu .......................... H05K 1/092

OTHER PUBLICATIONS

Lee et al. "Supersonically Sprayed Copper-Nickel Microparticles as Flexible and Printable Thin-Film High-Temperature Heaters". Adv. Mater. Interfaces (2017), 4, 1700075. (Year: 2017).*

(Continued)

*Primary Examiner* — Alexander M Weddle

(74) *Attorney, Agent, or Firm* — CPST Intellectual Property Inc.; Santosh K. Chari

(57) ABSTRACT

A method for coating a thermoplastic polymer substrate, the polymer including but not limited to a fluoropolymer such as polytetrafluoroethylene (PTFE), comprises forming a first layer of a first material on a surface of the substrate by cold spraying particles of the first material onto the surface of the thermoplastic substrate, and forming a second layer of a second material on a surface of the first layer, opposite to the substrate, by applying and adhering the second material onto to the first layer. A layered thermoplastic polymer substrate is also provided. Such layered thermoplastic substrates are well suited for use as flexible electronic circuits, as well as other electronic circuits applications.

23 Claims, 6 Drawing Sheets

(51) Int. Cl.
*H05K 1/18* (2026.01)
*H05K 1/189* (2026.01)

(56) References Cited

OTHER PUBLICATIONS

Akin et al.. "Cold spray-based rapid and scalable production of printed flexible electronics". Additive Manufacturing 60 (2022) 103244. (Year: 2022).*
Devaraj et al. "Thermal spray deposition of aluminum and zinc coatings on thermoplastics." Surface and Coatings Technology, vol. 399, Oct. 2020, vol. 399, 126114.
Liu et al. "Surface modification of PTFE by plasma treatment." Surface Engineering, vol. 16, 2000, 215-217.
Qi Qiang et al. "Robust conductive micropatterns on PTFE achieved via selective UV-induced graft copolymerization for flexible electronic applications." ACS Appl. Mater. Interfaces, vol. 11, Feb. 2019, 5517-5525.
Reznickova et al. "Plasma treatment of PTFE at elevated temperature: The effect of surface properties on its biological performance." Materials Today Communications, vol. 31, Jun. 2022, 103254.
Zettsu et al. "Surface functionalization of PTFE sheet through atmospheric pressure plasma liquid deposition approach." Surface & Coatings Technology, vol. 202, No. 22-23, Aug. 30, 2008, pp. 5284-5288.

* cited by examiner

FLEXIBLE POLYTETRAFLUOROETHYLENE SUBSTRATE WITH ELECTRICAL CIRCUIT LAYER AND METHOD THEREFOR

CROSS-REFERENCE TO RELATED APPLICATIONS

The present application claims priority to U.S. Application No. 63/427,782, filed Nov. 23, 2022, the contents of which are incorporated herein by reference as is set forth herein its entirety.

FIELD OF THE DESCRIPTION

The present description generally relates to surface coating methods, and more particularly, to a method for providing a surface coating materials, such as conductive materials, on thermoplastic substrates including but not limited to fluoropolymers such as polytetrafluoroethylene (PTFE). The description also relates to coated thermoplastic substrates, such as, PTFE coated with conductive materials.

BACKGROUND

Printed electronics are widely used in the manufacture of electronic devices. Methods of making such printed electronics generally comprises printing an electronic circuit and/or other components on a variety of substrates using an electrically conductive ink, such as inks comprising metals. It is one of the fastest growing technologies today that has become invaluable to several industries including flexible electronics, wireless networks, Internet of Things (IoT), consumer electronics, and so on. Each of these technologies relies heavily on the quality and performance of the printed electronics incorporated therein.

For example, in wireless networks, data transfer requirements have been rapidly expanded during the last few decades. In 2008, the International Telecommunication Union (ITU) defined the minimum data transfer speed of 100 Megabytes (MB) per second for the $4^{th}$ Generation (4G) wireless technology, with a theoretical expectation of increasing it to multiple orders of magnitude (e.g., 100 Gigabytes (Gb) per second) for the $5^{th}$ generation (5G) technology. However, the current commercialized 5G technology capacity has merely reached up to 20 Gb per second. Increasing the capacity of data transfer is currently limited by the available hardware and one of the limiting factors is the increased amount of heat generated in the hardware. With future advancements of these wireless technologies, this problem is expected to become even more acute.

Another challenge lies in the development of flexible printed circuits, or flex circuits, which comprise electronic circuits that are provided on flexible substrates. Flex circuits are commonly used in a wide range of electronic devices, such as cell phones, wearable devices, security tags, sensor components of cars and airplanes, and so on. Due to the ever-evolving nature of these technologies, the substrates used for such flex circuits is also required to have a high thermal resistivity to accommodate the performance requirements of the associated devices. Currently, the flexible substrates used in flex circuits have a temperature limitation of around 120° C. Thus, this temperature limitation also limits the application of flexible circuitry to those devices where heat generation is minimal.

Fluoropolymers are known for their high thermal resistivity, low dielectric, fire retardant, chemical and environmental stability. Polytetrafluoroethylene ("PTFE", also known as Teflon®) is one the fluoropolymers which is described further herein. PTFE has a number of unique properties including high strength and toughness, high melting point (close to 400° C.) compared to other polymers, low dielectric constant and power loss, chemical and thermal stability, and very low wettability. Moreover, PTFE is chemically inert (i.e., it is not affected by a majority of solvents), and has a high flexural strength as required for flexible electronics. Owing to these properties, PTFE has been considered to be a desirable candidate for use as a substrate in the manufacture of flexible electronics and printed electronics. However, for a number of reasons, the use of PTFE for manufacturing flexible circuits has been inhibited. Some of these reasons included its hydrophobicity, low coefficient of friction, poor wettability, and extremely low solid-air energy (~22 mJ/$m^2$). Indeed, PTFE is generally known as a "non-stick" surface. Consequently, depositing a layer of a metal or ceramic material on PTFE to provide an electrically conductive component has been extremely challenging.

Apart from printed electronics, another application that requires coating of a flexible material with metal is in the field of antennas. Although the chemical stability and mechanical properties of PTFE as discussed above would theoretically make it a desirable candidate for manufacturing communication network antennas, especially for automotive and aerospace industries, the limitations of PTFE, as also described above, have not enabled its use in such areas.

Some attempts have been made to print metallic or non-metallic patterns on PTFE. For example, Qi et al. (*ACS Appl. Mater. Interfaces,* 2019, 11, 5517-5525) attempted to fabricate functional micropatterns on the surface of a PTFE sheet by selectively irradiating plasma-treated PTFE coated with a monomer solution. The authors attempted to graft monomers on the desired areas of the PTFE substrate via selective ultraviolet (UV) irradiation. However, because of surface inertness of the PTFE substrate, it was found to be difficult for the monomers to be adsorbed on the surface, thereby resulting in nonhomogeneous and incomplete patterns. Further, the high stability of the carbon radicals connected to F atoms on the PTFE surface also results in nonhomogeneous growth of the patterns, making surface grafting more difficult than polymerization. To overcome this problem, Qi et al. introduced dopamine methacrylamide (DMA) as the monomer for surface graft copolymerization. The reference demonstrates that covalently bonded, dense, and uniform poly (dopamine methacrylamide) patterns (PDMA-ps) can be formed on the PTFE surface under UV irradiation. Subsequently, a layer of copper or silver is deposited on the PDMA pattern by an electroless coating approach, which prepares the substrate for electroplating with a metal coating. The solution proposed by this reference comprises a multi-step process that requires sophisticated equipment and expensive, toxic, and non-environmentally friendly chemicals.

Plasma cleaning is a valuable technique for improving material adhesion to Teflon® surfaces, addressing the inherent challenges of low surface energy and chemical resistance in such material. Liu, C. et al. (*Surface Engineering,* 2000, 16, 215-217) reported that the plasma cleaning process can remove surface contaminants and enhance the surface activity of Teflon® with gases like oxygen or argon. It plays a vital role in industries such as medical devices, electronics, and aerospace, where strong bonds with the Teflon® materials are essential. In another report, Alena Reznickova et al. (*Materials Today Communications,* 2022, 31, 103254) demonstrated the positive impact of plasma treatment at high temperatures on altering surface properties and the biological response of PTFE. These reports showed the advantages of plasma cleaning on Teflon® surfaces; however, this process has its drawbacks, including short-term effectiveness, potential surface damage with aggressive treatment and susceptibility to recontamination.

Devaraj et al. (Devaraj S. et al., *Surface and Coatings Technology,* 2020, Volume 399, 126114) describes depositing metals having a low a melting point such as zinc and aluminium on a PTFE substrate using wire-arc thermal spray coating. This reference describes that in a wire-arc thermal spray machine, the feed wire melts and forms droplets of metal, which are accelerated in a hot gas stream before impacting the PTFE surface. These hot droplets heat the PTFE surface to a temperature above its glass transition temperature, where the PTFE can flow and form mechanical interlocking with the metallic layer at the interface. Devaraj et al. teaches that surface roughness is vital in the adhesion enhancement between the metal coating and the PTFE substrate. This deposition technique taught in this reference is a consumable energy method that delivers high thermal energy to the PTFE substrate. However, such high level of heating cannot be applied to a thin sheet of PTFE substrate, such as that typically required by the printed electronics industry, because the thin sheet of PTFE will be locally melted and pierced by the impact of the high-density metal droplet. Moreover, the metals taught by Devaraj et al. having a lower melting point, such as zinc and aluminium, do not have enough electrical conductivity for use in electronic circuits. Hence, an extra step of coating the surface with a high conductivity material, such as copper or silver would be necessary. In addition, the thermal spray printing method does not provide the resolution required for printed electronics, thereby requiring a further etching step in order to create the necessary patterning for the electronic circuit.

Zettsu et al. (Zettsu, N. et al., *Surface and Coatings Technology,* 2008, v. 202, Issues 22-23, 5284-5288) teaches the functionalization of PTFE surface by atmospheric pressure plasma. This reference describes the use of helium plasma at atmospheric pressure to cover the PTFE surface with a thin liquid film containing a polymer (4-vinylpyridine) as a metal ion trapping polymer and copper acetate. The authors found this process to simultaneously provide the plasma-induced direct graft polymerization and reduction of copper atoms on the PTFE surface. The reduced copper atoms on the surface provide the seed for electroless plating of copper on the PTFE surface, which is then followed by copper or silver electroplating. However, as with the references described above, the solution provided by Zettsu et al. requires an expensive procedure and an additional step of subsequent etching of the coated metal for printing electronic patterns.

Thus, there exists a need for an efficient and/or cost-effective solution that overcomes one or more of the deficiencies in the currently known methods, as discussed above.

SUMMARY OF THE DESCRIPTION

In one aspect, there is provided a method for coating a thermoplastic polymer substrate with a first layer of a first material, and subsequently coating the first layer with a second layer of a second material. Preferably, the second material is a conductive material. The thermoplastic polymer is, in one aspect, polytetrafluoroethylene (PTFE). The second layer may be provided in the form of an electrical circuit or may be provided as a continuous layer that is subsequently etched or eroded to form an electrical circuit. The first layer may be provided using a cold spray method. In particular, the first layer may be provided by entraining particles of the first material in a carrier fluid to form a particle-containing stream and impacting the particles against a surface of the PTFE substrate. The particles are thereby deposited onto the PTFE surface and are mechanically bound thereto to form the first layer on the PTFE substrate. In one aspect, the first layer is formed with particles of a dielectric material, such as $TiO_2$ powder and the carrier fluid is nitrogen gas. The first layer provides a base for depositing the second layer.

Thus, in one aspect, there is provided a method for coating a thermoplastic polymer, the method comprising:

- cold spraying particles of a first material onto a surface of the thermoplastic substrate to form a first layer of the first material on the surface of the substrate; and,
- applying and adhering a second material onto a surface of the first layer, opposite to the substrate, to form a second layer on the PTFE substrate on the surface of the first layer.

In one aspect, there is provided a layered thermoplastic sheet comprising:

- a substrate layer comprising a thermoplastic material;
- a first layer provided on a surface of the substrate layer, the first layer comprising particles of a first material, wherein the first layer is formed by cold spraying the first material onto the surface of the substrate; and,
- a second layer comprising a second material, the second layer provided on and adhered to a surface of the first layer opposite the substrate.

In one aspect, the thermoplastic is a fluoropolymer, such as polytetrafluoroethylene (PTFE).

In one aspect, the thermoplastic substrate is flexible. In another aspect, the second material is electrically conductive.

BRIEF DESCRIPTION OF THE FIGURES

The features of certain embodiments will become more apparent in the following detailed description in which reference is made to the appended figures wherein.

DETAILED DESCRIPTION

Figure 1:
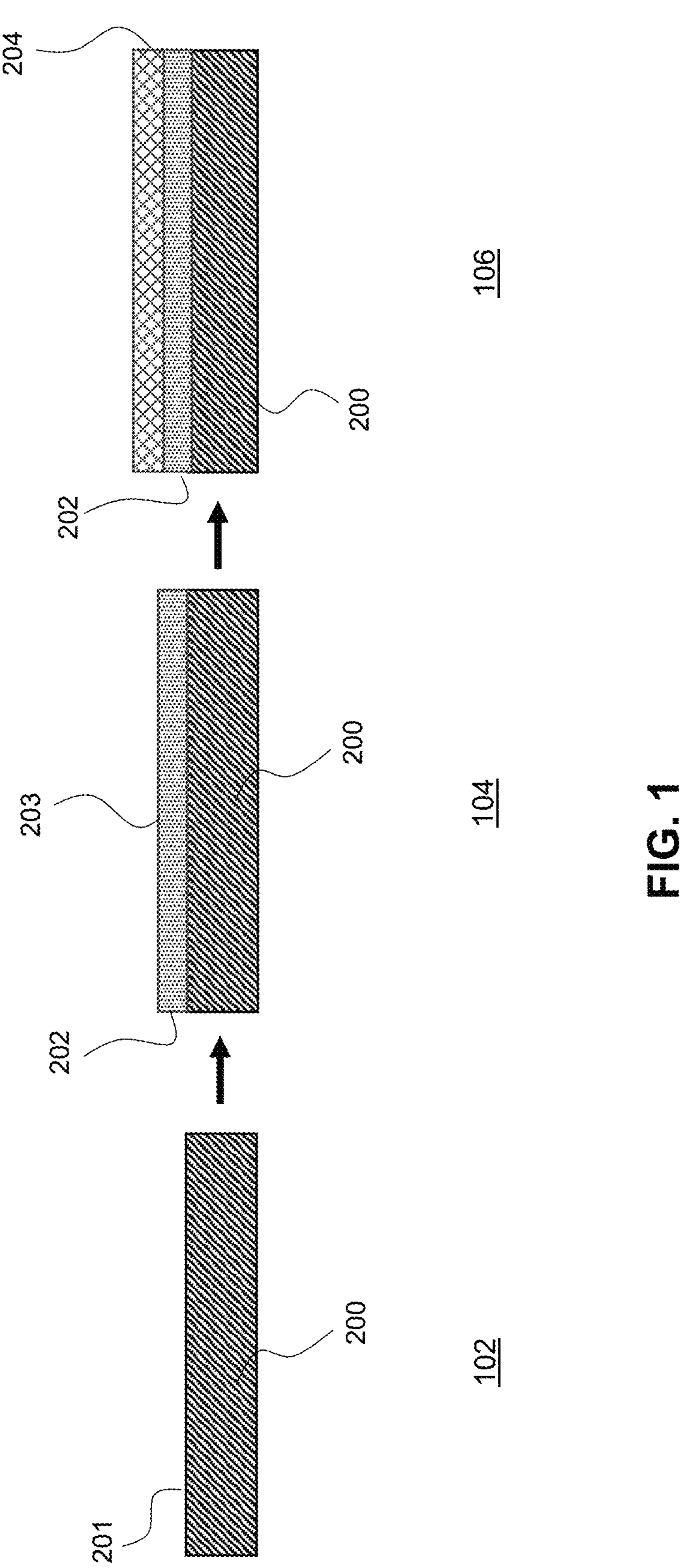
FIG. 1 schematically illustrates a method for coating a PTFE substrate according to an aspect of the present description.

The terms "comprise", "comprises", "comprised" or "comprising" may be used in the present description. As used herein (including the specification and/or the claims), and unless stated otherwise, these terms are to be interpreted as open-ended terms and as specifying the presence of the stated features, integers, steps, or components, but not as precluding the presence of one or more other feature, integer, step, component, or a group thereof as would be apparent to persons having ordinary skill in the relevant art. Thus, the term "comprising" as used in this specification means "consisting at least in part of". When interpreting statements in this specification that include that term, the features, prefaced by that term in each statement, all need to be present but other features can also be present. Related terms such as "comprise" and "comprised" are to be interpreted in the same manner.

The phrase "consisting essentially of" or "consists essentially of" will be understood as generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open-ended term, such as "comprising" or "including", it will be understood that direct support should be afforded also to "consisting essentially of" language as well as "consisting of" language as if stated explicitly and vice versa. In essence, use of one of these terms in the specification provides support for all of the others.

For the purposes of the present description and/or claims, and unless otherwise indicated, all numbers expressing quantities, percentages or proportions, and other numerical values used in the specification and claims, are to be understood as being modified in all instances by the term "about." Accordingly, unless indicated to the contrary, the numerical parameters set forth herein are approximations that may vary depending upon the desired properties sought to be obtained by the present invention, inclusive of the stated value and has the meaning including the degree of error associated with measurement of the particular quantity. The term "about" generally refers to a range of numbers that one of ordinary skill in the art would consider as a reasonable amount of deviation to the recited numeric values (i.e., having the equivalent function or result). For example, this term "about" can be construed as including a deviation of ±10 percent of the given numeric value provided such a deviation does not alter the end function or result of the value. Therefore, a value of about 1% can be construed to be a range from 0.9% to 1.1%.

The term "and/or" can mean "and" or "or". Unless stated otherwise herein, the articles "a" and "the", when used to identify an element, are not intended to constitute a limitation of just one and will, instead, be understood to mean "at least one" or "one or more".

Successful coating of materials with proper adhesion to thermoplastic polymer substrates, in particular a polytetrafluoroethylene (PTFE) substrates, can facilitate using such substrates in a variety of applications, such as in printed electronics, flexible electronics, electrical grounding of heating cable and heating panel set and the like. The present description provides a method for achieving this goal, wherein the method comprises depositing a first layer of one or more materials, such as metals, polymers, ceramics, etc., as a layer on a surface of a thermoplastic polymer, such as a PTFE substrate. In one aspect, the first layer may be deposited using a cold spray process, wherein particles of the material forming the first layer are applied with high velocity against the substrate surface, thereby causing the particles to be mechanically adhere thereto. The substrate, thus coated, can then be further coated with a second layer comprising a large variety of materials and using a variety of known methods. This is in view of the first layer providing a surface that is more amenable to adhering other substances than the thermoplastic polymer substrate. This is particularly the case where the substrate is PTFE.

The second layer may, for instance, comprise an electrically conductive material and may be applied, or printed, in the form of an electronic circuit. Alternatively, the second layer may be formed as a continuous layer over the first layer and may then be formed into a desired electronic circuit by etching or other such eroding process to remove select portions of at least the second layer.

The method described herein harnesses the deformability characteristics of the molecular structure of a thermoplastic polymer substrate, such as PTFE, to enable the mechanical deposition of the first layer of another material on the substrate without requiring modification of the surface chemistry or physical properties of the substrate and without affecting with the thermodynamic stability of the substrate.

FIG. 1 schematically illustrates a layered PTFE substrate according to an aspect of the present description and a method for forming same. It will be understood that FIG. 1 is provided solely to illustrate an aspect of the description and is not intended in any way to reflect or limit any dimensions or dimensional proportions of the layered substrate described herein.

As shown in FIG. 1, the first step 102 of the method comprises providing a PTFE substrate 200, having a first surface 201. In one aspect, the PTFE substrate 200 may be a sheet of any dimensions and of any thickness. For the purposes of forming flexible electronics, however, it will be understood that the substrate 200 would preferably be relatively thin, such as having a thickness of 1 mm or less. In one aspect, the substrate thickness, as known in the art, may range from 0.1 mm to 1 mm for the purposes of manufacturing a flexible circuit. However any other thickness of the substrate may be used where flexibility is not necessary. The present description is not limited to any dimensions of length, width, or thickness of the PTFE sheet. Similarly, the present description is not limited to any physical shape of the PTFE substrate. For example, although the substrate is described herein as a "sheet", primarily for the purposes of utilizing the substrate for flexible electronic circuits, any other shape of PTFE substrate may be used, as will be appreciated by persons skilled in the art having regard to the entirety of the present description.

In the next step, shown at 104, the first surface 201 of the PTFE substrate 200 is coated with a first material to form a first coating layer 202 thereon. As described herein, the first layer 202 serves to alleviate the hydrophobicity of the PTFE substrate 200 and to allow improved wettability and, thereby, provide an exposed surface 203, facing away from the PTFE substrate, to which one or more other materials may be applied and/or adhered. The thickness of the initial layer of dielectric coating can vary within a range from below 1 μm to above 1 mm depending on the processing parameters and need. Such control over the thickness of the dielectric layer allows this method to address the requirements of various applications, such as antennas, printed electronics, and circuit boards, as would be appreciated by persons skilled in the art.

In a subsequent step, shown at 106, the method comprises the application of a second coating layer 204, of a second material, on the exposed surface 203 of the second layer 202.

As indicated in FIG. 1, the exposed surface 203 of the second layer is layer opposite to the substrate 200. As described herein, the first coating layer 202 provides a base on the PTFE substrate onto which the second coating layer 204 can be adhered. The second coating layer 204 may be comprised of any material depending on the desired end application. For example, in the case of flexible electronics, the second material may comprise an electrically conductive material or ink, such as copper or silver. Other conducting materials will be apparent to persons skilled in the art. In one aspect, the second layer 204 may be applied using a printing method or other such process, which involves applying the layer in a specific pattern to define an electronic circuit. In another aspect, the second layer 204 may be continuous, covering all or a portion of the expose surface 203. In such case, a desired electronic circuit may be formed by removing portions of the applied second material. As will be appreciated by persons skilled in the art, the ability to print or apply a circuit onto a flexible and heat tolerant PTFE substrate offers a unique advantage for the electronics industry.

In general, the first layer 202 can comprise any material including conductive metal particles, ceramics, or polymers. However, for applications relating to electronics, the material forming the first layer 202 is preferably one having dielectric properties that are similar to or better than the dielectric properties of PTFE. For example, and particularly for applications as an electronics circuit, the first material forming the first layer 202 may preferably comprise a dielectric material, such as but not limited to: ceramics; titanium dioxide ($TiO_2$); aluminum oxide, or alumina ($Al_2O_3$); silicon dioxide (SiO2); and silicon nitride ($Si_3N_4$); or any mixtures or combinations thereof. Other dielectric materials would be known to persons skilled in the art. The present description is not limited to any particular dielectric material(s).

As discussed above, and as well known in the art, adhering any material to PTFE is difficult given its inherent characteristics. For the present description, the inventors utilized a unique, essentially mechanical process for forming the first coating layer 202. Namely, the first material for forming the first coating layer was provided in the form of solid particles that were entrained in a fluid and then sprayed onto the first surface 203 of the PTFE substrate. In one aspect, the process utilized a cold spray deposition technique. As known in the art, a cold spray process is an additive manufacturing technology that can be performed at a temperature that is lower than the melting point of the materials used for coating or that of the substrate being coated. The process involves accelerating particles of the coating material, entrained in a fluid medium, to a high speed and applying such stream of particles as a spray against a surface of a substrate to be coated. In this way, the particles impinge against the substrate surface thereby deforming such surface and resulting in the particles being embedded therein by means of mechanical interlocking. This type of process can be used to form any desired thickness of the first layer 202. Further, using a low-pressure cold spray process, which involves pressures of roughly 5-20 bars for example, would be well suited for the present description where the PTFE substrates may be thin (e.g., ≤1 mm).

In one aspect of the description, the cold gas spray technology may be implemented using micron size of particles (such as metals or ceramic particles as described above), which are accelerated in a gas (e.g., air, N, or He) stream through a converging/diverging nozzle (such as a deLaval nozzle) and impacted against the PTFE surface. The particles can be accelerated to the local speed of sound (i.e., sonic speed) or higher (i.e., supersonic speed), thereby providing the particles with sufficient kinetic energy before impacting the PTFE surface, such energy being sufficient to allow the particles to be embedded and trapped on the surface of the substrate. In one aspect, the carrier gas could be heated to a temperature to facilitate deformation of the PTFE surface. It will, however, be understood that the temperature should not exceed the melting point of the particles. It will also be understood that the thickness and roughness of the deposited layer can be controlled by controlling various spray parameters. Some examples of such parameters for controlling the thickness and/or the surface roughness of the first coating layer 202 include, but are not limited to, the carrier gas temperature, carrier gas pressure, powder (particle) feed rate, and travel speed through the nozzle. Such tailoring of parameters is described, for example, by Marzbanrad et al. (Marzbanrad B., et al.; Customization of Residual Stress Induced in Cold Spray Printing, *Journal of Material Processing Tech*., vol. 289, 2021, p. 116928), which is incorporated herein by reference in its entirety.

Figure 2:
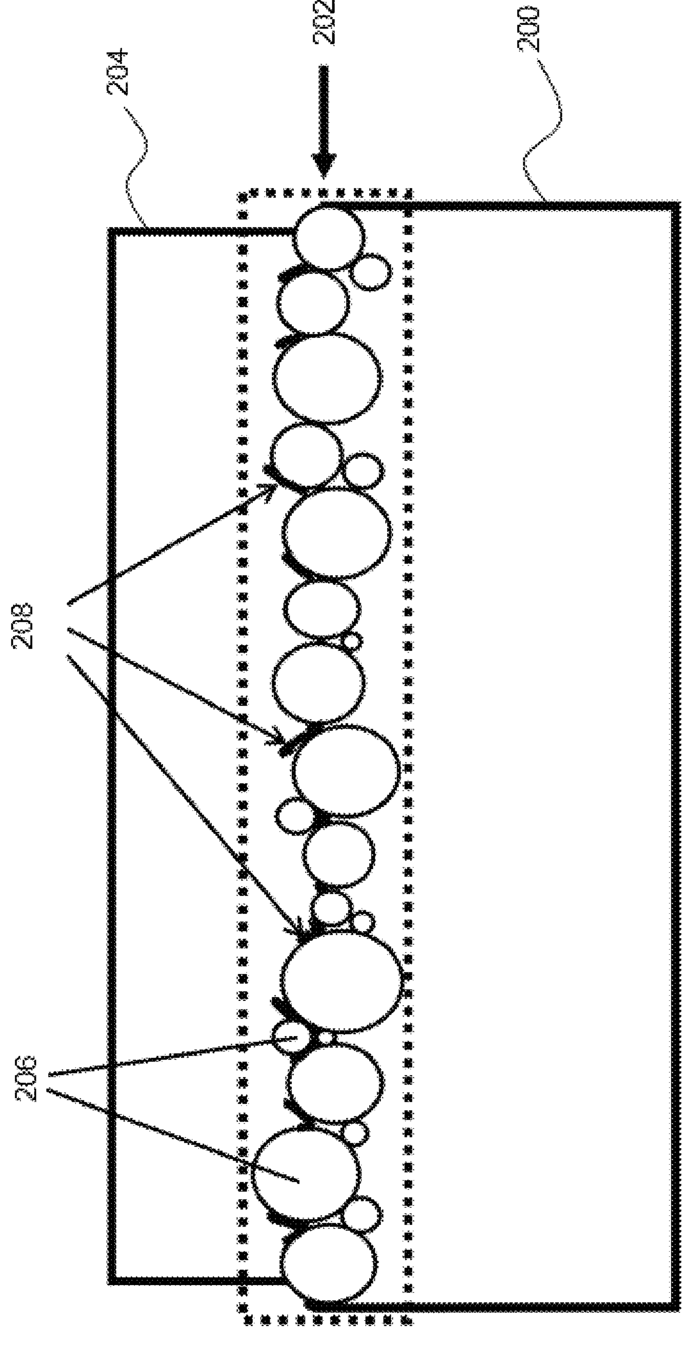
FIG. 2 schematically illustrates a PTFE substrate coated with first and second layers, according to an aspect of the description.

FIG. 2 illustrates a coated PTFE substrate according to an aspect of the description, wherein the mechanical bonding between particles 206 of the first material of the first coating layer 202 is illustrated. As shown, the particles 206 are initially embedded as an initial surface coating on the first surface (shown at 201 in FIG. 1) of the PTFE substrate 200. FIG. 2 also illustrates at 208 portions of the PTFE material that is jetted outward upon impacting of the first material particles. Additional deposition of particles 206 increases the thickness of the first layer 202.

As discussed above, the first coating layer 202 may be comprised of a dielectric material and several examples of same were provided. In view of the preferred cold spray method of applying the first layer, it will be appreciated that material forming such layer would be one that can induce a sufficient adhesion as to remain on the substrate after impact.

As discussed above, the second material may be deposited as a second coating layer 204 onto the exposed surface 203 of the first coating layer 202 using any known technologies, including, but not limited to, cold spray deposition, electroplating, lithography, or electroless coating. As also discussed above, the second layer 204 may be printed in the form of a desired circuit or provided as a continuous coating, after which the desired circuit may be formed using an etching or other material removal method.

As described above, and in contrast to previous attempts to coat PTFE substrates, the method described herein does not modify the surface chemistry or physical properties of the PTFE or alter the thermodynamic stability of the PTFE. Instead, the approach presented herein involves deposition of a layer of a material on the PTFE substrate using the deformability characteristics of the PTFE molecular structure. In short, the method comprises accelerating a stream of the particles of the coating material to a high velocity and directing the stream to impact the surface of the PTFE. Upon impact, the high-energy particles will embed on the surface of the PTFE and be mechanically bound thereto. The energy for impingement and embedding of the particles into the substrate is provided by the kinetic energy of the particles. Therefore, the process described herein can be conducted at room temperature. It will, however, be understood that, where necessary, the addition of thermal energy to the process (e.g., by supplying heat to below the melting point of the particles and substrate) may facilitate the particle impingement, the PTFE deformation, and/or the mechanical bond formation therebetween.

The coated PTFE substrate described herein exhibits excellent wetting and adhesion characteristics by materials such as silver ink, with the resulting coating having high electrical conductivity and low surface roughness. Given that the second coating layer, that is the conductive layer, can be applied using a printing method, an electronic circuit can be provided directly without necessarily requiring an additional step, such as surface preparation and/or chemical etching. However, a method including such additional step is also encompassed by the present description.

As will be appreciated, the method and resulting layered product provided by the present description offers several advantages over known methods of preparing PTFE substrates for uses such as electronic circuits and the like.

EXAMPLES

To illustrate the described method and product, we employed $TiO_2$, $Al_2O_3$, AA6061 (aluminum alloy), and copper particles as model materials and deposited them successfully on the surface of a PTFE substrate. The experiments showed that this coating technology creates a thin dense layer of particles on the PTFE substrate, which is mechanically interlocked with PTFE while the coating has a relatively low surface roughness of around 1 μm.

In one of the trials, we coated a layer of $TiO_2$ on the PTFE, and then printed a layer of silver on the coated sample. For this trial, a PTFE sheet (ePlastics, USA) was used, the sheet having dimensions of 12"×12" (300 mm×300 mm), and a thickness of 0.03" (0.76 mm). $TiO_2$ powder (Tayca Corporation, Japan) was used for the first coating layer. The $TiO_2$ had an average particle size of 13 μm. For the deposition of the $TiO_2$ powder on the PTFE sheet, a low-pressure, supersonic spray system, SST™ Series P Cold Spray System (CenterLine (Windsor) Limited), was used, with $N_2$ gas serving as the carrier for the particles. The parameters for the cold spray step are provided in Table 1.

TABLE 1

Cold Spray Coating Parameters

| # | Carrier Gas Temp. (° C.) | Carrier Gas Press. (PSI) | $TiO_2$ Powder Feed Rate (g/min) | Nozzle Speed (mm/s) | Distance to PTFE Surface (mm) | Step Over (mm) | Number of Layers |
|---|---|---|---|---|---|---|---|
| 1 | 300 | 220 | 6 | 200 | 12 | −1 | 2 |
| 2 | 300 | 220 | 6 | 100 | 12 | −1 | 2 |
| 3 | 300 | 220 | 6 | 50 | 12 | −1 | 1 |
| 4 | 300 | 220 | 6 | 80 | 12 | −1 | 1 |
| 5 | 300 | 220 | 6 | 100 | 12 | −1 | 1 |
| 6 | 300 | 220 | 6 | 100 | 12 | −1 | 1 |
| 7 | 300 | 220 | 6 | 100 | 12 | −1 | 1 |

The "distance" recited in Table 1 refers to the distance between the nozzle and the PTFE surface, and is also be referred to as "stand off distance". The term "step over" in Table 1 means that when the first cycle of printing is finished, the nozzle travels back 1 mm inside the previously printed cycle and thereby begins printing partially on the top of same to form an overlap.

Various parameters were tested to determine their impact on the deposition process. These parameters included the carrier gas temperature, carrier gas pressure, $TiO_2$ powder feed rate, nozzle speed, distance to the PTFE surface, step over distance, and the number of layers. Throughout all 20 tests, the carrier gas temperature remained constant at 300° C., and the $TiO_2$ powder feed rate was set at 6 g/min. However, the carrier gas pressure ranged from 80 to 220 PSI, the distance to the PTFE surface varied between 12 and 15 mm, and the step over distance varied from −0.25 to −1 mm. Additionally, the nozzle speed ranged from 10 to 200 mm/s. In these tests, a variable number of layers were applied, ranging from 1 to 5 layers. These variations were made to study the effects of different parameters on the deposition process and to optimize the desired outcome for the given application.

Figure 3:
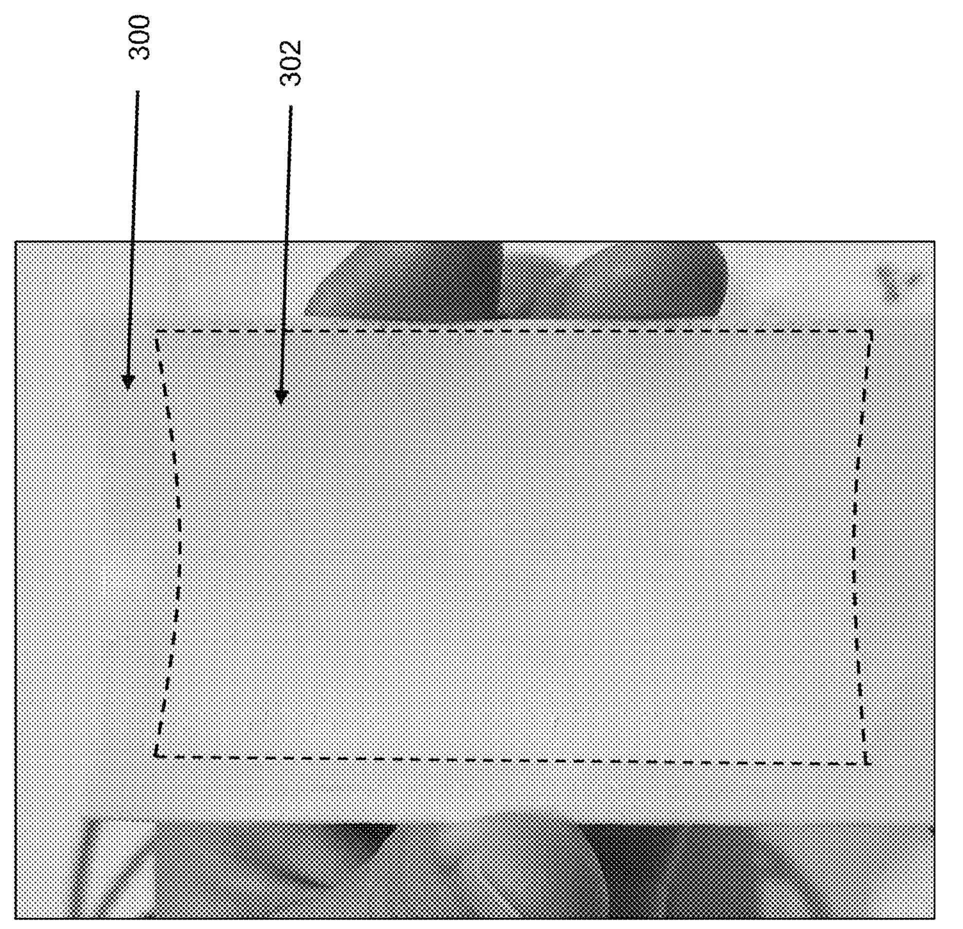
FIG. 3 is a photograph illustrating an example of a PTFE substrate having a first layer of $TiO_2$ applied thereto.

FIG. 3 illustrates the PTFE substrate sheet 300 having coated thereon a first coating layer 302 comprising a layer of $TiO_2$, which was deposited using the cold spray method as discussed herein. In FIG. 3, the first coating layer has been identified with a broken line for greater visibility.

As illustrated, the $TiO_2$ layer was successfully and fully provided over the surface of the PTFE substrate and exhibited excellent adherence. As illustrated in FIG. 3, the flexibility of the PTFE sheet was retained even after being coated with the $TiO_2$ layer.

Figure 4:
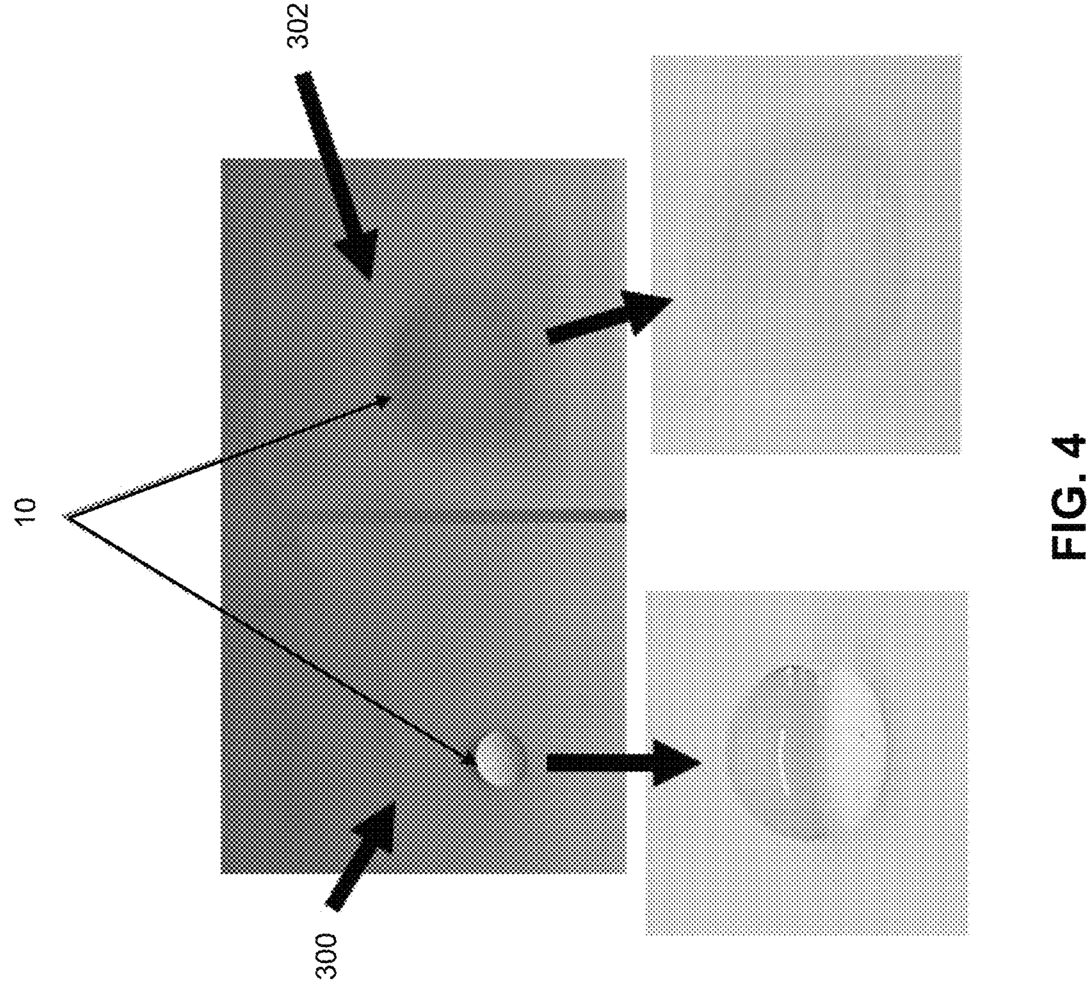
FIG. 4 compares the wettability of a PTFE substrate before and after being coated with a $TiO_2$ layer.

FIG. 4 illustrates the comparative wettability of the PTFE substrate 300 alone and the $TiO_2$ layer 302 deposited thereon. In this test, a 50 μl drop of DI water, illustrated at 10, was used. As shown in the photographs, the coated PTFE exhibited excellent wettability.

Figure 5B:
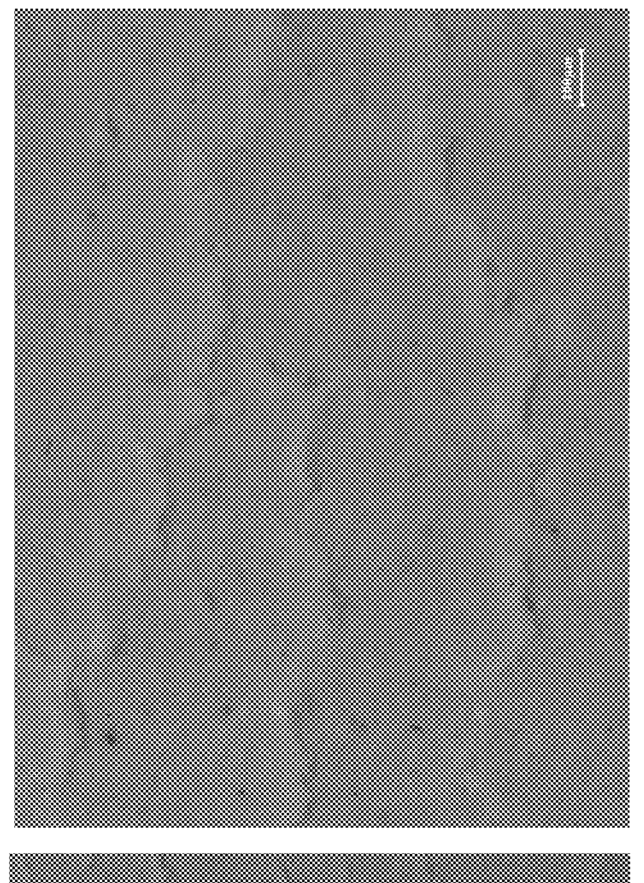
FIGS. 5*a* and 5*b* illustrate magnified images of a PTFE surface coated with a $TiO_2$ layer.
Figure 5A:
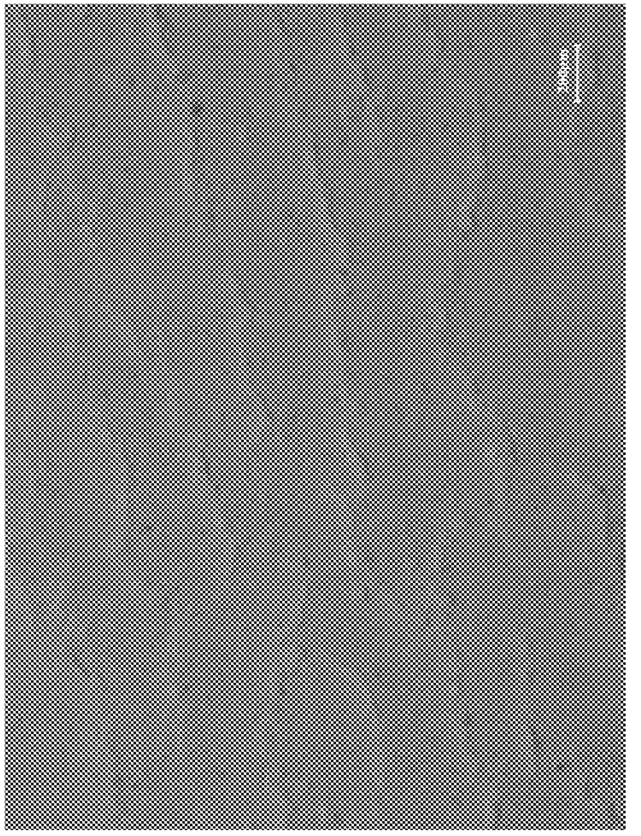

FIGS. **5*a* and 5*b* illustrate the comprehensive and smooth coating of $TiO_2$ on the PTFE substrate that was achieved with the cold spray process described above. FIGS. 5*a* and 5*b*** illustrate the $TiO_2$ coated surface at two different magnifications (scale 200 μm and 100 μm, respectively).

Figures 6, 7:
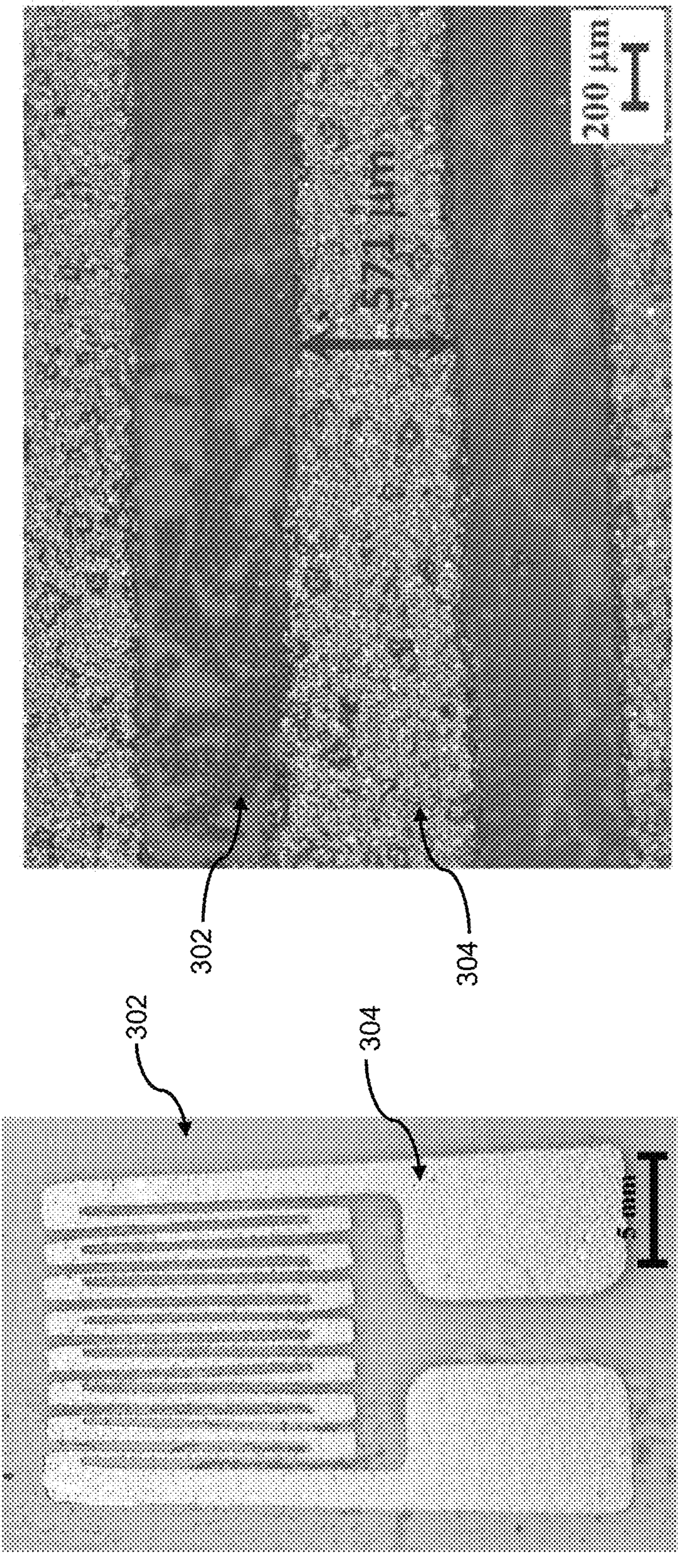
FIG. 6 illustrates an example of a PTFE substrate having a first coating layer comprising $TiO_2$ and a second coating layer formed by printing of silver ink.
FIG. 7 illustrates a magnified section of the image of FIG. 6.

As shown in FIG. 6 and FIG. 7, following deposition of the $TiO_2$ layer 302, the coated PTFE substrate was then subjected to a printing step, wherein a second layer 304 comprising a silver ink was deposited, or printed onto the $TiO_2$ surface in a patterned form representing a circuit. The printed second layer 304 is illustrated in FIG. 6 and FIG. 7 illustrates a magnified portion of the printed silver layer 304 of FIG. 6. These figures illustrate the quality and precision of the silver layer 304 that was deposited. The printed circuit was found to exhibit desired resistivity (of 0.5Ω).

Although the above description includes reference to certain specific embodiments, various modifications thereof will be apparent to those skilled in the art. Any examples provided herein are included solely for the purpose of illustration and are not intended to be limiting in any way. Any drawings provided herein are solely for the purpose of illustrating various aspects of the description and are not intended to be drawn to scale or to be limiting in any way. The scope of the claims appended hereto should not be limited by the preferred embodiments set forth in the above description but should be given the broadest interpretation consistent with the present specification as a whole. The disclosures of all prior art recited herein are incorporated herein by reference in their entirety.

We claim:

1. A method for forming a layered thermoplastic polymer sheet, the method comprising:

cold spraying particles of a first material onto a surface of a thermoplastic substrate to form a first layer of the first material on the surface of the substrate; and, applying and adhering a second material onto a surface of the first layer, opposite to the substrate, to form a second layer on the thermoplastic substrate on the surface of the first layer;

wherein the first material comprises a dielectric material and the second material comprises an electrically conductive material.

2. The method of claim 1, wherein:

the thermoplastic polymer is a fluoropolymer.

3. The method of claim 2, wherein the fluoropolymer is polytetrafluoroethylene (PTFE).

4. The method of claim 2, wherein the second layer is applied in the form of a pattern, wherein the pattern is an electronic circuit.

5. The method of claim 2, wherein the second layer is applied as a continuous layer on the first layer, the method further comprising removing portions of the second layer to form a pattern, wherein the pattern is an electronic circuit.

6. The method of claim 1, wherein the particles of the first material are of a micron size.

7. The method of claim 1, wherein the first material is a ceramic, metal, or polymer material.

8. The method of claim 1, wherein the first material is a ceramic material, titanium dioxide ($TiO_2$); aluminum oxide or alumina ($Al_2O_3$); silicon dioxide ($SiO_2$); silicon nitride ($Si_3N_4$); or any mixture or combination thereof.

9. The method of claim 1, wherein the substrate has a thickness of less than 1 mm.

10. The method of claim 1, wherein the first layer is applied to a thickness of from less than 1 μm to greater than 1 mm.

11. The method of claim 1, wherein the particles of the first layer are entrained in a fluid to form a particle stream and wherein the particle stream is applied to the substrate through a nozzle.

12. The method of claim 11, wherein the fluid or the particle stream is heated prior to application to the substrate, wherein such heating is up to a temperature below the melting point of the particle material or the substrate material.

13. The method of claim 11, wherein the particles are accelerated to sonic or supersonic speed.

14. A layered thermoplastic polymer sheet comprising:

a substrate layer comprising a thermoplastic material;

a first layer provided on a surface of the substrate layer, the first layer comprising particles of a first material, wherein the first layer is formed by cold spraying the first material onto the surface of the substrate; and, a second layer comprising a second material, the second layer provided on and adhered to a surface of the first layer opposite the substrate;

wherein the first material comprises a dielectric material and the second material comprises an electrically conductive material.

15. The layered thermoplastic polymer sheet of claim 14, wherein:

the thermoplastic polymer is a fluoropolymer.

16. The layered thermoplastic polymer sheet of claim 15, wherein the fluoropolymer is polytetrafluoroethylene (PTFE).

17. The layered thermoplastic polymer sheet of claim 14, wherein the second layer is in the form of a pattern, wherein the pattern is an electronic circuit.

18. The layered thermoplastic polymer sheet of claim 17, wherein the pattern is formed by removing portions of the second material after being adhered to the surface of the first layer.

19. The layered thermoplastic polymer sheet of claim 14, wherein the particles of the first material are of a micron size.

20. The layered thermoplastic polymer sheet of claim 14, wherein the first material is a ceramic material; titanium dioxide ($TiO_2$); aluminum oxide or alumina ($Al_2O_3$); silicon dioxide ($SiO_2$); silicon nitride ($Si_3N_4$); or any mixture or combination thereof.

21. The layered thermoplastic polymer sheet of claim 14, wherein the substrate has a thickness of less than 1 mm.

22. The layered thermoplastic polymer sheet of claim 14, wherein the first layer is applied to a thickness of from less than 1 μm to greater than 1 mm.

23. A flexible electronic circuit comprising the layered thermoplastic polymer sheet of claim 14.

* * * * *